United States Patent
Groe

(10) Patent No.: US 6,205,325 B1
(45) Date of Patent: Mar. 20, 2001

(54) ACTIVE RADIO FREQUENCY MIXER CIRCUIT WITH FEEDBACK

(75) Inventor: John B. Groe, Poway, CA (US)

(73) Assignee: Nokia Mobile Phones, Limited, Espoo (FI)

( * ) Notice: Subject to any disclaimer, the term of this patent is extended or adjusted under 35 U.S.C. 154(b) by 0 days.

(21) Appl. No.: 09/223,906

(22) Filed: Dec. 31, 1998

(51) Int. Cl.[7] ................................ H04B 1/28; H04B 1/26
(52) U.S. Cl. .................... 455/333; 455/317; 455/319; 455/313; 455/323; 455/118
(58) Field of Search ..................... 455/313, 317, 455/318, 319, 323, 326, 333; 330/84

(56) References Cited

U.S. PATENT DOCUMENTS

| | | | |
|---|---|---|---|
| 5,465,420 | * 11/1995 | Dougherty et al. | 455/333 |
| 5,548,840 | * 8/1996 | Heck | 455/326 |
| 5,678,226 | * 10/1997 | Li et al. | 455/333 |
| 6,104,242 | * 8/2000 | Ezell | 330/252 |

* cited by examiner

*Primary Examiner*—William Cumming
*Assistant Examiner*—Alan T. Gantt

(57) ABSTRACT

An active mixer circuit, and an associated method, includes a feedback element which increases the linearity of the mixer circuit so that the mixer circuit is operable over a wider dynamic range than typically permitted of conventional, active mixer circuits. The mixer circuit includes a transconductance stage including a pair of transconductance transistors. Signals are applied through both of the transconductance transistors in parallel. The feedback element is coupled to an output side of a first of the transconductance transistors. And, a mixing stage is coupled to an output side of a second of the transconductance transistors.

20 Claims, 4 Drawing Sheets

ACTIVE RADIO FREQUENCY MIXER CIRCUIT WITH FEEDBACK

The present invention relates to a mixer circuit with feedback that provides improved linearity over a wider dynamic range. Furthermore, the structure of the present invention enables a low noise transconductance stage to drive a low capacitance mixing stage with improved switching speed, higher frequency operation, and reduced local oscillator drive.

BACKGROUND OF THE INVENTION

The use of multi-user, radio communication systems has achieved wide popularity in recent years. Advancements in communication technologies have permitted the implementation of such radio communication systems to be afforded by a large number of users.

In a radio communication system, a communication channel connects a sending and a receiving station. A communication channel uses a portion of the electromagnetic spectrum to create a wireless connection, replacing wire line connections. Communication by way of a radio communication system provides the particular advantage of untethered communications.

A sending station of a radio communication system converts information which is to be communicated to the receiving station into a signal with characteristics that permit its propagation over the communication channel. To convert the information into a communication signal, the sending station modulates the information onto a carrier wave with an assigned frequency.

Mixer circuits typically form a portion of a sending station. The information to be communicated by the sending station is initially at baseband frequency. The mixer circuit of the sending station up-converts in frequency the baseband information. A sending station sometimes includes more than one mixer circuit. When multiple mixing stages are utilized, an IF (intermediate frequency) signal is formed at the first mixer stage and a RF (radio frequency) signal is formed at the final mixing stage of the sending station.

A typical receiving station receives a radio frequency communication signal by way of a communication channel and analogously converts the radio frequency signal into a baseband signal. Thereafter, the information of the received communication signal is recovered. The receiving station utilizes one or more mixer circuits to down-covert in frequency the received communication signal into a baseband signal. When multiple mixing stages are utilized, an IF signal is formed at the first mixer stage and a baseband signal is formed at the final mixing stage.

The performance of the receiving station is defined, amongst other things, by its sensitivity and selectivity. Sensitivity is the ability of the receiving station to recover information in the presence of noise and depends on various factors, including noise figure, information bandwidth, and carrier-to-noise ratio requirements. The noise figure is set by the front-end down converter of the receiving station. Selectivity is the ability of the receiving station to isolate information amongst interfering signals. The selectivity of the receiving station is determined by channel filtering and signal handling characteristics.

The mixer circuit plays a big part in determining the performance of the receiving station. A typical front-end down converter of the receiving station includes a low noise amplifier, an image rejection filter, and a mixer circuit. A conventional mixer circuit is generally categorized to be either a passive circuit or an active circuit.

Passive mixer circuits generally exhibit a low noise figure and are operable over a wide dynamic range. However, passive mixer circuits generally require relatively high local oscillator drive and low noise IF (intermediate frequency) amplification to compensate for relatively high insertion loss. When power considerations are significant, such as when the mixer circuit is to form a portion of a low power integrated circuit, powered by a portable power supply, the relatively high power requirements associated with passive mixer circuits are disadvantageous.

Conversely, active mixer circuits exhibit higher noise figures and operate over narrower dynamic ranges. However, active mixer circuits use less power because they require less IF amplification and lower local oscillator drive. The reduced power requirements of active mixer circuits are generally preferred in applications related to low-power, integrated electronics. These active mixer circuits are especially advantageous for mobile stations used in radio communication systems, such as cellular communication systems. However, for these requirements, standard active mixer circuits do not offer high enough performance and improved active mixer circuits are needed.

An active mixer exhibiting improved dynamic range and ease of design would be advantageous. Such an active mixer could form a portion of a mobile station operable in a cellular, or other radio, communication system.

It is in light of this background information related to mixer circuits that the significant improvements of the present invention have evolved.

SUMMARY OF THE INVENTION

The present invention provides a mixer circuit that operates over a wider dynamic range than permitted by conventional active mixers.

The active mixer circuit includes a transconductance stage which is coupled to receive an input signal. The transconductance stage includes a pair of transconductance elements, each coupled to receive the input signal. A feedback element is coupled from the output of the first of the transconductance elements to the received input signal. The output of the second transconductance element is coupled to a mixing stage, which forms a portion of the mixer circuit. The mixing stage convolves the output of the second transconductance element with a mixing signal.

Feedback in a conventional mixer is not practical because the output of the mixer is at a frequency that is different from the frequency of the input signal. Feedback is effective in the present invention because the output of the first transconductance element is at the same frequency as the input to the transconductance stage. Furthermore, it is the transconductance stage that is the largest contributor to distortion in conventional mixer circuits. Such feedback extends the linearity and, thereby, the dynamic range of the mixer circuit.

Another advantage of the present invention is that the transconductance stage is realized with parallel or multiple elements. Here, the bias current and composite geometries can be chosen to minimize the noise figure. Typically, a large geometry device is used, which can be realized by multiple devices in parallel. A large geometry transistor or multiple devices require sizeable current to realize peak operating frequency. In a standard mixer circuit, the bias current of the transconductance stage feeds directly to the switching transistors of the mixer circuit. These switching transistor elements are sized to handle all the bias current. These transistors are consequently large geometry, possessing high capacitance values, which limits the high frequency performance of the active mixer and burdens the LO buffer amplifiers. In the present invention, only a portion of the input signal bias current is provided to the mixing stage and the switching transistors can be sized smaller than required of conventional mixer circuits. Such smaller sizes reduce the parasitic capacitances of the switch transistors and also reduce the time required for their switching operation. The multi-element construction of the transconductance stage permits the geometry of the switch transistors of the mixing stage to be optimized, independent of the geometry of the transconductance stage and associated bias current.

A mixer circuit embodiment of the present invention forms a portion of the front-end, down converter section of a radio receiver, such as the radio receiver utilized in a cellular communication system. RF signals representative of the received signal are applied to the mixer circuit. Down-mixing local oscillator signals are also applied to the mixing circuit, which produces a down-converted signal. The IF signal is then provided to an I/Q demodulator which translates it to baseband.

Another embodiment of the present invention is utilized to form a portion of a transmitter, such as the transmitter used in a cellular communication system. IF signals are applied to the mixer circuit together with an up-mixing signal. The mixer circuit generates up-mixed RF communication signals.

A mixer circuit of yet another embodiment of the present invention forms a portion of the I/Q modulator, or I/Q demodulator, of a transmitter or receiver, respectively.

Because the mixer circuit incorporates feedback, the circuit generates an output signal that is linear over a wider dynamic range compared to conventional active mixer circuits. Furthermore, the selection of transistor geometry and bias current for the transconductance stage is decoupled from the choice of switch transistor size; this greatly eases design.

In these and other aspects, therefore, a mixer circuit with feedback is provided for mixing together an input signal with a mixing signal to form a mixed signal. An amplifying stage has a first transistor having a first input side and a first output side. The amplifying stage also has a second transistor having a second input side and a second output side. Both inputs of the amplifying stage are coupled to receive the input signal. The first transistor generates a first amplified signal at the first output side and the second transistor generates a second amplified signal at the second output side. A feedback element is coupled between the first output side and the input side of the first transistor of the amplifying stage. And, a mixing stage is coupled to the second output side of the second transistor of the amplifying stage and is coupled to receive the mixing signal. The mixing element mixes together the second amplified signal and the mixing signal, to form the mixed signal.

A more complete appreciation of the present invention and the scope thereof can be obtained from the accompanying drawings which are briefly summarized below, the following detailed description of the presently-preferred embodiments of the present invention, and the appended claims.

DETAILED DESCRIPTION

Figure 1:
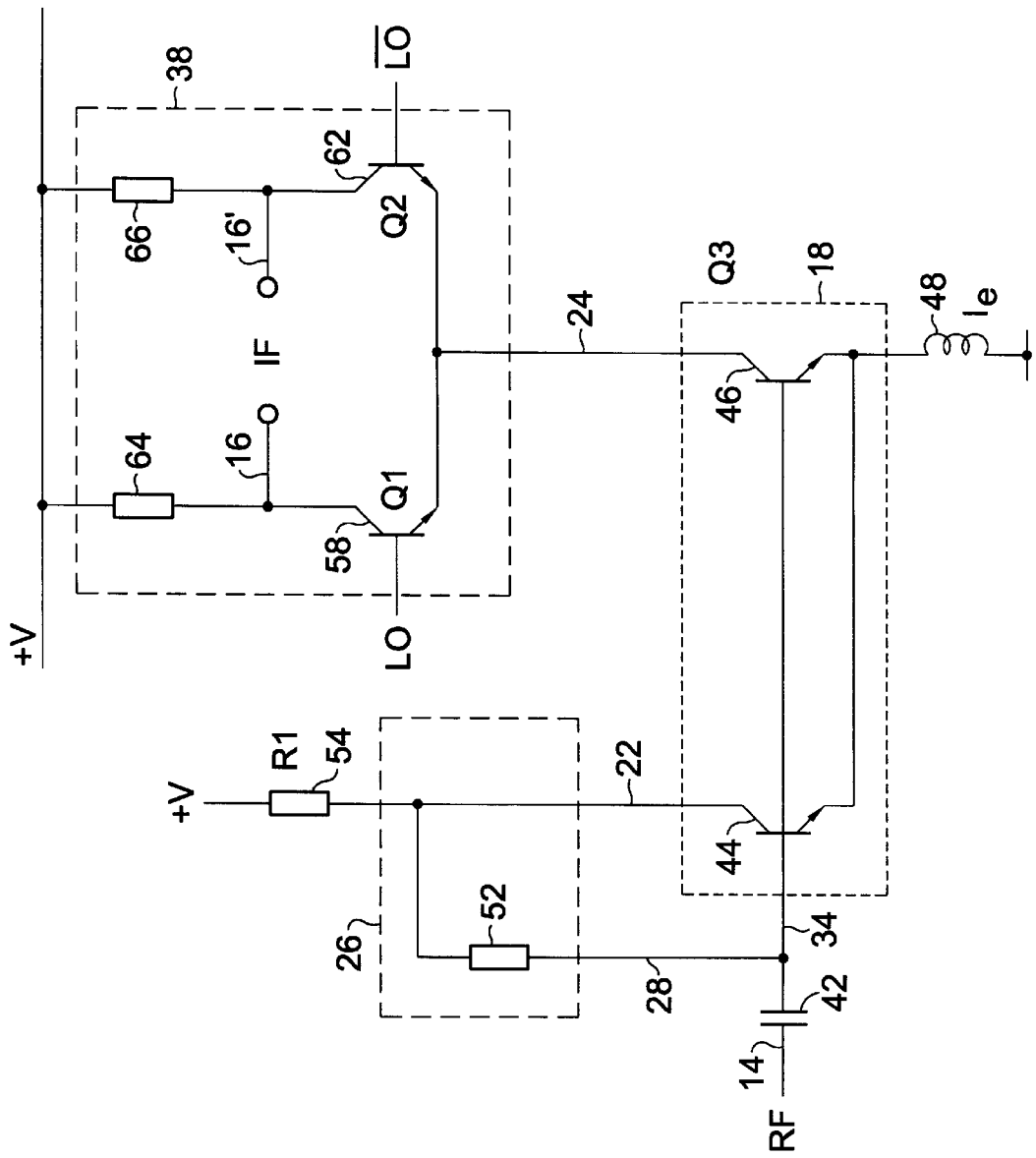
FIG. 1 illustrates a circuit schematic of a mixer circuit of an embodiment of the present invention.

FIG. 1 illustrates the mixer circuit of an embodiment of the present invention. The mixer circuit is shown to include a transconductance stage 18, a feedback element 26, and a mixing stage 38. Signals generated by the transconductance stage 18 on the lines 22 and 24 are applied to the feedback element 26 and the mixing stage 38, respectively. And, the feedback line 28 is shown to extend from the feedback element 26. Input signals generated on the line 14 are combined together with feedback signals generated on the line 28 and thereafter applied, by way of the line 34 to the portions of the transconductance stage 18. The input signals generated on the line 14 are passed by way of a series-connected capacitor 42.

The signals generated on the line 34 are applied, in parallel, to the transistors 44 and 46 of the transconductance stage 18. The transistors 44 and 46 form the first and second elements, respectively, of the transconductance stage 18. The transistors 44 and 46 are each transconductance amplifiers which form output current signals on the lines 22 and 24, respectively, in response to the voltage signals applied on line 34. In the exemplary implementation illustrated in the Figure, the transistors 44 and 46 are bipolar junction transistors, and the line 34 is coupled to the base electrodes of these transistors. The emitter electrodes of the transistors 44 and 46 are connected to a common potential through an inductor 48. The inductor 48 is of an inductance value $L_e$, representing emitter inductance. Also in the exemplary implementation, the transistors of the transconductance stage 18 are biased to achieve an input impedance of 50 ohms, deliver low noise performance, and provide linear transconductance. To achieve low noise performance, the geometries of the transistors are selected to be relatively large devices with low active base resistance. Typically, a bias current of a few milli-amperes is chosen.

The input resistance of the transistors is approximated by the following equation:

$$R_{IN} \approx r_b - pL_e\beta_0$$

for frequencies above the dominant pole (p) of the forward current gain ($\beta$), where $r_b$ is the active base resistance and $\beta_0$ is the DC value of $\beta$.

From this expression, a value of the inductor 48 is chosen. The inductor provides noiseless feedback and extends the dynamic range of the transconductance stage.

The feedback element 26 is here shown to be formed of an impedance element 52 coupled between the collector and base electrodes of the transistor 44. The feedback element 26 creates a local shunt feedback path which generates a feedback signal on line 28. When the feedback signal is combined with the signal generated on the line 14, the linearity of the transconductance stage 18 and the dynamic range of the resultant mixer circuit is improved. Feedback is possible since the frequencies of the signals at the base and collector electrodes of the transistor 44 are of the same frequencies.

The mixer circuit further includes a load element 54 coupled between the collector electrode of the transistor 44 and a bias source. The amount of feedback is adjustable by both the value of feedback element 52 and the load element 54.

The mixing stage 38 is here shown to include switch transistors 58 and 62, here also bipolar junction transistors. Differential mixing signals are applied to the base electrodes of the transistors 58 and 62. The emitter electrodes of the transistors 58 and 62 are commonly coupled to the line 24 extending from the collector electrode of the transistor 46 of the transconductance stage 18. And, the collector electrodes of the transistors 58 and 62 are coupled through load elements 64 and 66, respectively, to a bias voltage source. The bias voltage source coupled to the mixing stage 38 may be biased with the same source as that to which the load element 54 is coupled.

The input signal 14 is simultaneously applied to both transistor 44 and 46. These transistors also share the same emitter potential via a common connection at 49. Since their base emitter voltages are identical, the bias currents for transistors 44 and 46 are just scaled versions of each other. The relationship is dependent on device geometries. Therefore, the current applied to load element 54 is an exact duplicate of that applied to the transistors 58 and 62 of the mixing stage 38.

The collector current generated on the line 22 is transformed to an output voltage across the load element 52 to produce a feedback current on the line 28. Because of this feedback the transconductance stage exhibits significantly less distortion than that exhibited by transconductance elements of conventional mixer circuits. The noise figure is slightly higher, but comparable to conventional active mixers since the dominant components remain unchanged.

The current generated at the line 24 is a fraction of the bias current applied to the transconductance stage 18. A portion of the bias current is shunted away from the mixing stage 38 and transistors 58 and 62 to the feedback elements. As a result, the geometry of the switch transistors 58 and 62 and their signal current can be optimized independent of the transconductance stage.

Figure 2:
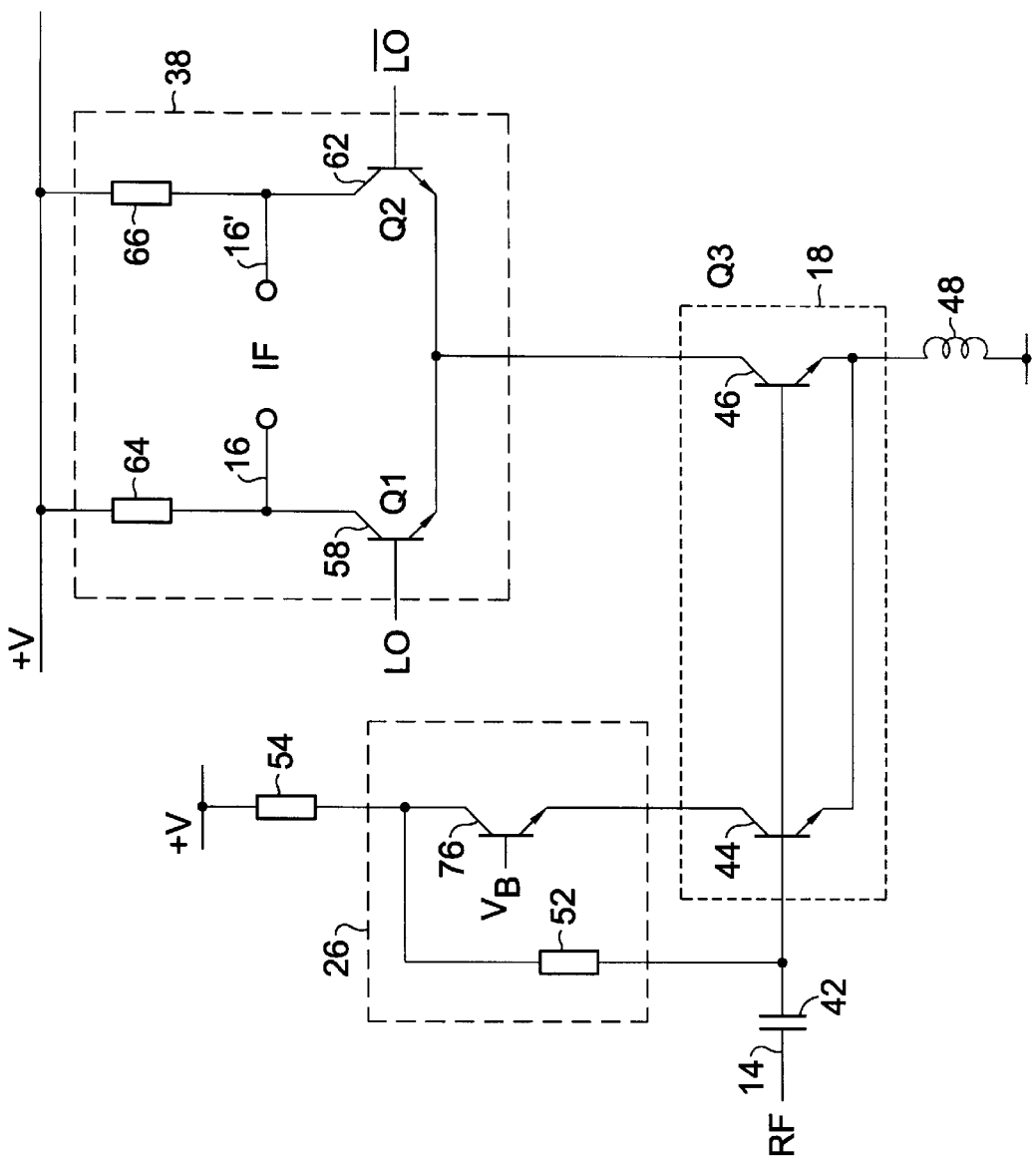
FIG. 2 illustrates another circuit schematic of a mixer circuit of another embodiment of the present invention.

FIG. 2 illustrates a mixer circuit 10 of another embodiment of the present invention that is similar to that of the embodiment shown in FIG. 1. Circuit elements of the embodiment shown in FIG. 2 that have counterparts in the embodiment of FIG. 1 are commonly-referenced. Details of the operation of such commonly-referenced elements are as noted above.

The mixer circuit 10 of the embodiment shown in FIG. 2 further includes a cascode transistor element 76 coupled between the collector electrode of the transistor 44 of the transconductance stage 18 and a common node at which the feedback element 52 and the load element 54 are commonly connected. The bias voltage applied to the base electrode of the transistor is similar to that applied to mixing transistors 58 and 62. This duplicates the voltage applied at the collector of transistor 46 and isolates the effect of voltage changes across load element 54. Consequently, the operation of transistor 44 may match better the operation of transistor 46, making the feedback provided by element 52 more effective.

Figure 3:
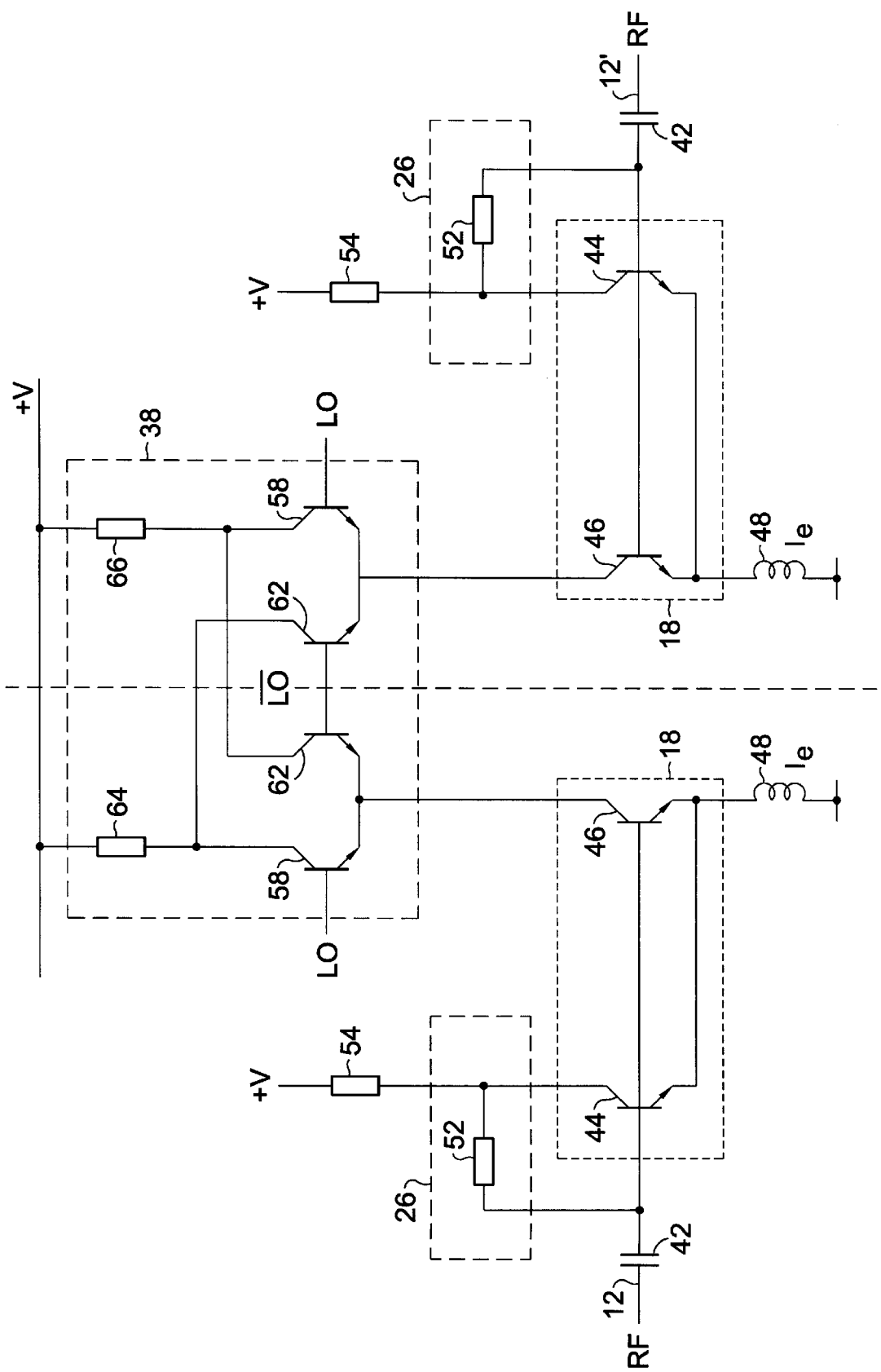
FIG. 3 illustrates a circuit schematic of a mixer circuit of yet another embodiment of the present invention.

FIG. 3 illustrates a mixer circuit 10 of another embodiment of the present invention. The mixer circuit 10 of the embodiment shown in FIG. 3 forms a differential circuit in which the input signal applied to the circuit forms a differential signal having a first differential input signal generated on the line 12 and a second differential input signal generated on the line 12'. Because of the differential nature of the circuit 10 of the embodiment shown in FIG. 3, the circuit is formed of matched circuit elements, symmetrical about the line 82, shown in dash in the Figure. Circuit elements forming portions of the embodiment of the mixer circuit shown in FIG. 3 which correspond to circuit elements described previously with respect to the embodiments shown in FIGS. 1–2 are again indicated with common designations. The mixer circuit 10 is operable to receive differential input signals, to mix such differential input signals with differential mixing signals and to generate differential, mixed signals.

Figure 4:
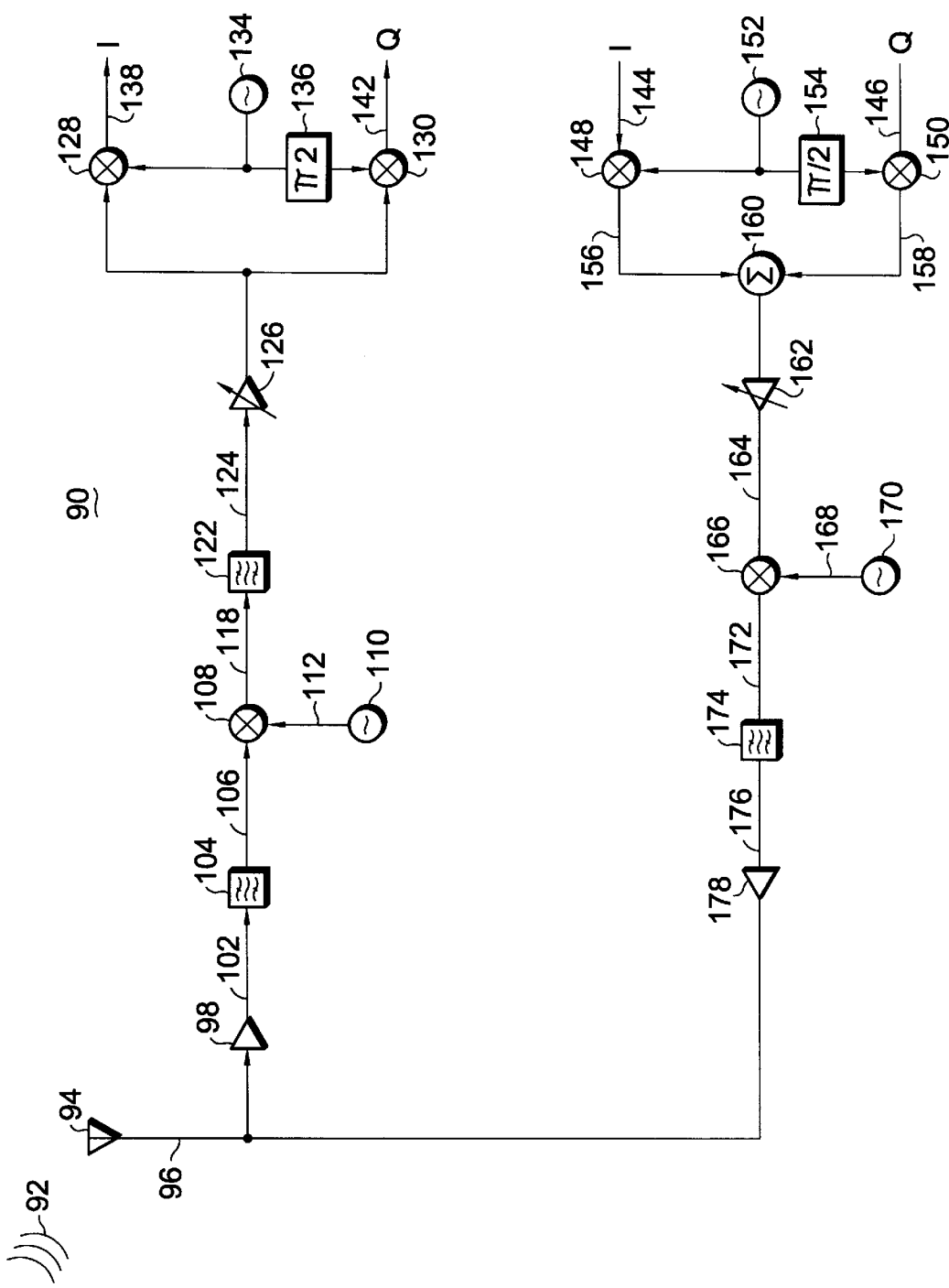
FIG. 4 illustrates a block diagram of a radio transceiver which includes an embodiment of the present invention as a portion thereof.

FIG. 4 illustrates a radio transceiver, shown generally at 90, which includes the mixer circuit 10 of an embodiment of the present invention. The transceiver 90 illustrates the components of an exemplary transceiver, such as a radio transceiver operable in a cellular communication system. Other constructions of transceivers can also include the mixer circuit embodiment of the present invention.

Electromagnetic signals 92 transmitted to the radio transceiver 90 are detected by an antenna transducer and converted into electrical form on the line 96. The line 96 is coupled to an amplifier 98, which amplifies electrical signals. Amplified signals are generated on the line 102 and are filtered by the filter 104.

The filter 104 here generates filtered signals on the line 106 which is coupled to a first input of a mixer circuit 10, one embodiment of the present invention. Mixing signals generated by an oscillator 110 on the line 112 are applied to a second input of the mixer circuit. The mixer circuit generates down-mixed signals on the line 118 which are filtered by a filter 122. The filter 122 filters the applied signals and generates a filtered signal on the line 124. The filtered signals generated on the line 124 are amplified by a variable gain amplifier 126.

Amplified signals formed by the amplifier 126 are applied to an I/Q demodulator. The I/Q demodulator includes two mixer circuits, mixer circuits 128 and 130 to which the amplified signals generated by the variable amplifier are applied as inputs. Oscillating signals generated by an oscillator 134 are applied to second inputs of the mixers 128 and 130. The oscillating signal generated by the oscillator 134 is offset by a phase shifter 136 prior to application to the mixer 130. I and Q signals are generated on the lines 138 and 142 by the respective mixers 128 and 130. In one implementation of the present invention, the mixer circuits 128 and 130 correspond in structure to the mixer circuit 10 shown in a preceding Figure.

The transceiver further includes a transmitter portion for transmitting electromagnetic signals therefrom. I and Q signals are generated on the lines 144 and 146 for application to mixer circuits 148 and 150. In one implementation of the present invention, the mixer circuits 148 and 150 correspond in structure to the mixer circuit 10 of an embodiment shown in the preceding Figures. Oscillating signals generated by an oscillator 152 are applied to second inputs of the mixers 148 and 150. The oscillating signal applied to the mixer 150 is phase-shifted by a phase shifter 154 prior to its application to the mixer 150. Mixed signals generated on the lines 156 and 158 by the mixers 148 and 150, respectively, are summed together by a summer 160, and the summed signals are amplified by the variable gain amplifier 162. Amplified signals generated on the line 164 are applied to a mixer circuit 10, the embodiment of the present invention. A second input of the mixer circuit 10 is coupled to receive an oscillating signal on the line 168 generated by the oscillator 170. Up-mixed signals formed by the mixer circuit 10 are generated on the line 172 and filtered by a filter 174.

The filter 174 generates filtered signals in the line 176 which are amplified by an amplifier 178 and thereafter provided to the antenna transducer 94 to be radiated.

Through use of the mixer circuit of the present invention, improved mixer performance is possible. The mixer circuit of the present invention exhibits linear characteristics over a wider dynamic range than conventional active mixer circuits. In addition, the design of the transconductance stage is decoupled from the design of the mixing stage allowing ease of design. This enables a low noise transconductance stage to drive a low capacitance mixing stage which improves performance, including switching speed, high frequency operation and reduced LO buffer drive.

The previous descriptions are of preferred examples for implementing the invention, and the scope of the invention should not necessarily be limited by this description. The scope of the present invention is defined by the following claims.

I claim:

1. A mixer circuit for mixing together an input signal with a mixing signal to form a mixed signal, said mixer circuit comprising:
    an amplifying stage having a first transistor having a first input side and a first output side, the first input side coupled to receive the input signal and a second transistor having a second input side and a second output side, the second input side coupled to receive the input signal, the first transistor for generating a first amplified signal at the first output side and the second transistor for generating a second amplified signal at the second output side;
    a feedback element coupled between the first output side and the input side of the first transistor of said amplifying stage; and
    a mixing element coupled to the second output side of the second transistor of said amplifying stage and coupled to receive the mixing signal, said mixing element for mixing together the second amplified signal and the mixing signal, thereby to form the mixed signal.

2. The mixer circuit of claim 1 further comprising a resistive element coupled between the first output side of the first transistor of said amplifying stage and a bias source, said resistive element coupled to the first output side at a node common to said feedback element.

3. The mixer circuit of claim 2 wherein said mixing element is further coupled to the bias source such that a current generated at said resistive element corresponds in magnitude to a current generated at said mixing element.

4. The mixer circuit of claim 1 wherein the input signal comprises a voltage signal, wherein the first amplified signal comprises a current signal of a first current level responsive to voltage levels of the voltage signal and wherein the second amplified signal comprises a current signal of a second current level responsive to the voltage levels of the voltage signal.

5. The mixer circuit of claim 4 wherein the first transistor comprises a first transconductance transistor, wherein the second transistor comprises a second transconductance transistor, and wherein said amplifying stage comprises a transconductance stage.

6. The mixer circuit of claim 1 wherein said mixing element comprises a first switching transistor and a second switching transistor couple in parallel between the second output side of the second transistor of said amplifying stage and a bias source.

7. The mixer circuit of claim 6 wherein the first switching transistor and the second switching transistor are of substantially corresponding transistor characteristics.

8. The mixer circuit of claim 7 wherein the transistor characteristics of the first switching transistor and the second switching transistor which substantially correspond comprise transistor geometrics, the transistor geometries selected to be of sizes permitting application of the second amplified signal thereto.

9. The mixer circuit of claim 1 wherein the input signal comprises a receive signal representative of a radio signal of a radio-signal frequency received at a radio receiver, wherein the mixing signal is of a mixing-signal frequency less than the radio signal frequency and wherein said mixing element forms the mixed signal of a down-mixed frequency.

10. The mixer circuit of claim 1 wherein the input signal comprises a transmit signal of a transmit-signal frequency, wherein the mixing signal is of a mixing-signal frequency greater than the transmit signal frequency and wherein said mixing element forms the mixed signal of an up-mixed frequency.

11. The mixer circuit of claim 1 wherein said feedback element comprises a feedback resistor which exhibits a selected feedback resistance.

12. The mixer circuit of claim 1 wherein the input signal comprises a differential input signal pair, wherein the mixing signal comprises a differential mixing signal pair, wherein said amplifying stage comprises a first differential amplifying portion and a second differential amplifying portion the first transistor comprising a first-portion first transistor and second-portion first transistor, and the second transistor comprising a first-portion second transistor and second-portion second transistor, the first-portion first transistor and the first-portion second transistor forming the first differential amplifying portion and the second-portion first transistor and the second-portion second transistor forming the second differential amplifying portion.

13. The mixer circuit of claim 12 wherein said feedback element comprises a first feedback element and a second feedback element, said first feedback element coupled between the first-portion first transistor and the first-portion second transistor of said first differential amplifying portion and said second feedback element coupled between the second-portion first transistor and the second-portion second transistor of said second differential amplifying portion.

14. The mixer circuit of claim 13 wherein said mixing element is coupled to both said first differential amplifying portion and said second differential amplifying portion and wherein the mixed signal generated by said mixing element is formed of a first differential mixed signal and a second differential mixed signal.

15. In a radio receiver operable to receive a downlink signal transmitted thereto, an improvement of a mixer circuit coupled to receive a receive signal representative of the downlink signal and a down-mixing signal, said mixer circuit forming a down-mixed signal therefrom, said mixer circuit comprising:
    an amplifying stage having a first transistor having a first input side and a first output side, the first input side coupled to receive the receive signal and a second transistor having a second input side and a second output side, the second input side coupled to receive the receive signal, the first transistor for generating a first amplified signal at the first output side and the second transistor for generating a second amplified signal at the second output side;
    a feedback element coupled between the first output side and the input side of the first transistor of said amplifying stage; and
    a mixing element coupled to the second output side of the second transistor of said amplifying stage and coupled to receive the down-mixing signal, said mixing element for mixing together the second amplified signal and the down-mixing signal, thereby to form the down-mixed signal.

16. In a radio transmitter, an improvement of a mixer circuit having a transmit signal applied to a first input thereof and a mixing signal applied to a second input thereof, said mixer circuit for forming an up-mixed signal, said mixer circuit comprising:

an amplifying stage having a first transistor having a first input side and a first output side, the first input side coupled to receive the transmit signal and a second transistor having a second input side and a second output side, the second input side coupled to receive the transmit signal, the first transistor for generating a first amplified signal at the first output side and the second transistor for generating a second amplified signal at the second output side;

a feedback element coupled between the first output side and the input side of the first transistor of said amplifying stage; and a mixing element coupled to the second output side of the second transistor of said amplifying stage and coupled to receive the up-mixing signal, said mixing element for mixing together the second amplified signal and the up-mixing signal, thereby to form the mixed signal.

17. A method for mixing together an input signal with a mixing signal to form a mixed signal, said method comprising:

applying, in parallel, the input signal to a first transistor and to a second transistor of an amplifying stage, the first transistor having a first input side and a first output side and the second transistor having a second input side and a second output side;

generating a first amplified signal at the first output side of the first transistor;

generating a second amplified signal at the second output side of the second transistor;

coupling the first amplified signal generated at the first output side of the first transistor by way of a feedback element to the first input side of the first amplifier;

applying the second amplified signal to a mixing element;

applying the mixing signal to the mixing element;

mixing together the second amplified signal applied to the mixing element with the mixing signal, thereby to form the mixed signal.

18. The method of claim 17 wherein the input signal applied to the amplifying stage comprises a voltage signal and wherein the first amplified signal and the second amplified signal comprise current signals, the current signals of current levels related to voltage levels of the voltage signal.

19. The method of claim 17 wherein said step of coupling comprises shunting a first portion of the first amplified signal to the first input side of the first transistor.

20. The method of claim 19 comprising the additional operations of: coupling the first amplified signal generated at the first output side of the first transistor to a load element; and shunting a second portion of the first amplified signal to the load element.

* * * * *